United States Patent [19]

Nii et al.

[11] Patent Number: 5,391,410
[45] Date of Patent: Feb. 21, 1995

[54] PLASMA CVD OF AMORPHOUS SILICON THIN FILM

[75] Inventors: Tetsuro Nii, Tokyo; Porponth Sichanugrist, Kanagawa; Takahisa Kase, Tokyo, all of Japan

[73] Assignee: Showa Shell Sekiku K.K., Tokyo, Japan

[21] Appl. No.: 68,070

[22] Filed: May 28, 1993

[30] Foreign Application Priority Data

Jun. 3, 1992 [JP] Japan .................................. 4-142660
Dec. 21, 1992 [JP] Japan .................................. 4-356379

[51] Int. Cl.$^6$ .............................................. B05D 3/06
[52] U.S. Cl. .................................. 427/578; 427/573; 427/574; 427/255.1; 427/255.2
[58] Field of Search ................. 427/578, 255.1, 255.2, 427/573, 574

[56] References Cited

U.S. PATENT DOCUMENTS

| | | | |
|---|---|---|---|
| 4,047,998 | 9/1977 | Yoshikawa | 427/100 |
| 4,398,054 | 8/1983 | Madan | 427/578 |
| 4,631,198 | 12/1986 | Kakinuma et al. | |
| 4,634,601 | 1/1987 | Hamakawa et al. | 427/578 |
| 4,998,968 | 3/1991 | Misumi | 427/569 |
| 5,137,560 | 8/1992 | Ohmura | 427/126.2 |
| 5,140,397 | 8/1992 | Haga et al. | |

FOREIGN PATENT DOCUMENTS

| | | |
|---|---|---|
| 2049150 | 3/1992 | Canada . |
| 3644654 | 7/1987 | Germany . |
| 119001 | 10/1978 | Japan .................................. 427/100 |
| 57-90933 | 6/1982 | Japan . |

OTHER PUBLICATIONS

Cros et al, "IR, ESR and resistivity measurements on amorphous silicon oxynitride films prepared by PECVD at low temperature", J. Non-cryst. Solids, 90(1–3) pp. 287–290, 1987.

The 22nd IEEE Photovoltaic Specialists Conference, Las Vegas, Oct. 7–11, 1991, p1-6.

Ichikawa et al, "12% Two-Stacked a-Si:H tandem cells with a new P-layer Structure".

Patent Abstracts of Japan, vol. 016, No. 074 (E-1170) 24 Feb. 1992.

Japanese Journal of Applied Physics, vol. 25, No. 12, Dec. 1986, Tokyo JP, pp. 1778–1782, T. Kamimura et al 'Effect on Hydrogen Dilution of Silane in Hydrogenated Amorphous Silicon Films Prepared by Photochemical Vapor Deposition'.

Japanese Journal of Applied Physics, vol. 25, No. 1, Jan. 1986, Tokyo JP, pp. L7–L9, T. Yoshida et al, 'New Material for P-type Window Layer in A-Si Solar Cells'.

*Primary Examiner*—Roy V. King
*Attorney, Agent, or Firm*—Sughrue, Mion, Zinn, Macpeak & Seas

[57] ABSTRACT

An amorphous silicon thin film is disclosed, which is produced by plasma CVD in which hydrogen-diluted $SiH_4$ and $N_2O$ are supplied during chemical vapor deposition as reacting source gases for the chemical vapor deposition, wherein the degree of hydrogen dilution is from 10 to 20.

3 Claims, 1 Drawing Sheet

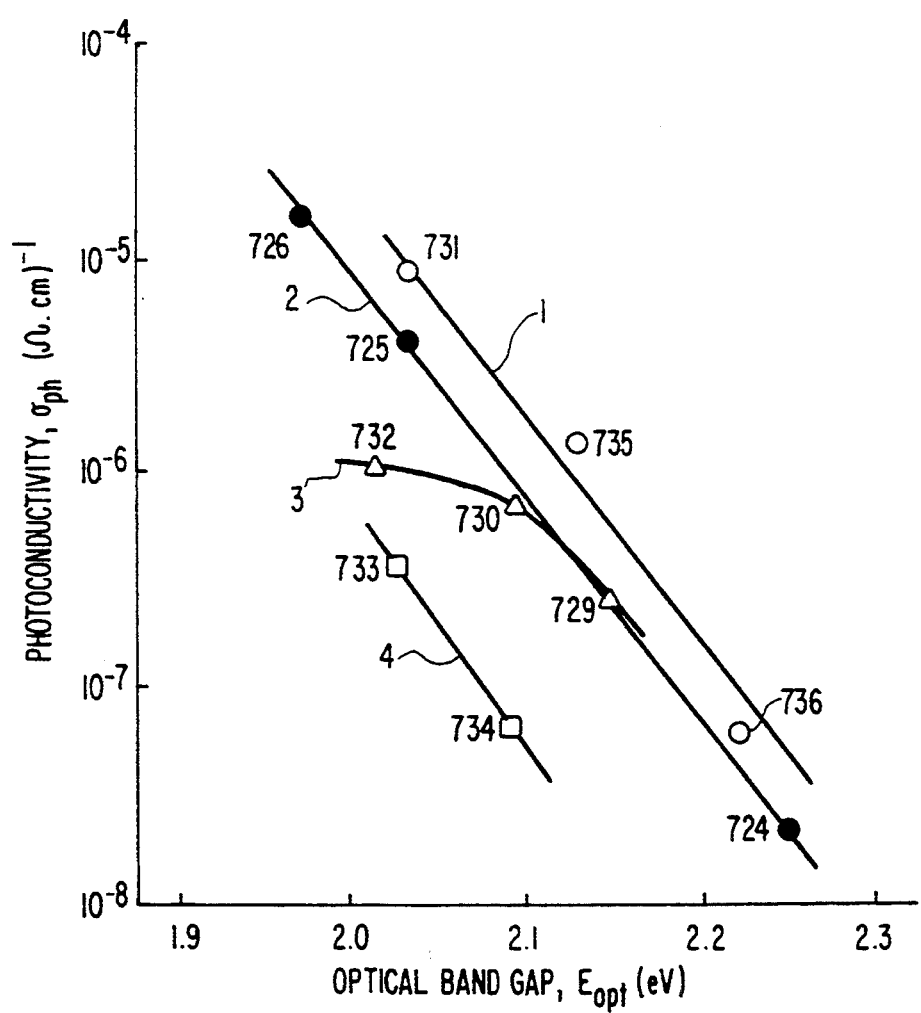

PLASMA CVD OF AMORPHOUS SILICON THIN FILM

FIELD OF THE INVENTION

The present invention relates to an amorphous silicon thin film for use in solar cells, optical sensors, and the like. More particularly, the present invention relates to an amorphous silicon thin film suited for use as buffer layers and i-layers in amorphous-silicon solar cells of the single type and the integrated type.

BACKGROUND OF THE INVENTION

For the purpose of increasing the optical band gap of a buffer layer in the case of fabricating an amorphous-silicon solar cell of the single type, and preferably for the purpose of increasing the optical band gaps of the buffer layer and i-layer of a top cell in the case of fabricating an amorphous-silicon solar cell of the integrated type, use is being made of a hydrogenated amorphous silicon film and a hydrogenated amorphous silicon carbide film, both produced by a method in which $SiH_4$ as a major source gas is diluted with hydrogen. In addition, an a-SiO:H (amorphous-SiO:H) film produced from hydrogen-diluted $SiH_4$ and $CO_2$ gases has come to be used recently for that purpose. In particular, it has been reported that such an a-SiO:H film produced from an $SiH_4$-$CO_2$ system by the hydrogen dilution method attained a photoconductivity higher by about one order of magnitude than that of a conventional a-SiC:H film produced from an $SiH_4$-$CH_4$ system by the hydrogen dilution method and having the same optical band gap, showing that the a-SiO:H film had higher quality than the conventional a-SiC:H film (The 22nd IEEE Photovoltaic Specialists Conference, pp. 1296–1301).

An a-Si:H film, a-SiC:H film, a-SiO:H film, and the like are used as buffer layers and i-layers in amorphous-silicon solar cells of the single type and integrated type. In particular, for use as the buffer layer and i-layer in the top cell of an amorphous-silicon solar cell of the integrated type, an amorphous silicon thin film is regarded as promising because it is of high quality and can be made to have a wider band gap. In other words, there is a desire for an amorphous silicon thin film having a higher conductivity and a wider optical band gap than the conventional amorphous silicon thin films obtained by decomposing a mixed gas comprising a highly hydrogen-diluted $SiH_4$ gas and either $CO_2$ or $CH_4$ by the plasma CVD (chemical vapor deposition) method.

SUMMARY OF THE INVENTION

An object of the present invention is to provide an amorphous silicon thin film having a high conductivity and a widened band gap and to provide a process for producing the same.

The above and other objects are accomplished, in one aspect of the present invention, by an amorphous silicon thin film which has been produced by plasma CVD method in which $SiH_4$ and $N_2O$ are supplied during chemical vapor deposition as reacting source gases for the chemical vapor deposition.

The present invention further provides, in another aspect thereof, an amorphous silicon thin film produced by plasma CVD method in which hydrogen-diluted $SiH_4$ and $N_2O$ are supplied during chemical vapor deposition as reacting source gases for the chemical vapor deposition.

The addition of $N_2O$ to $SiH_4$ makes it possible to produce a high-quality amorphous silicon (a-Si:O:N:H) thin film which has a higher photoconductivity, even when it has the same optical band gap. Further, the dilution of the $SiH_4$ gas with hydrogen serves to diminish defects in the film.

The preferred ratio of $N_2O$ $SiH_4$ is 0.25 to 1.5 as flow rate.

By use of the amorphous silicon thin film having a wide band gap as the buffer layer of a single type amorphous-silicon solar cell or as the buffer layer and i-layer of an integrated type amorphous-silicon solar cell, the cell voltage can be heightened and the performance can be improved.

BRIEF DESCRIPTION OF THE DRAWING

The sole Figure of the drawing is a graph showing the relationships between optical band gap ($E_{opt}$) and photoconductivity ($\sigma_{ph}$) for amorphous silicon thin films of Examples 2 and 3 and Comparative Examples 2 and 3.

DESCRIPTION OF PREFERRED EMBODIMENTS

The present invention will be explained below in more detail with reference to the following examples, but the invention is not construed as being limited thereto.

Amorphous silicon thin films having thicknesses of about 3,000 to 4,000 Å were formed by the plasma CVD method on a transparent electrode formed on 7059-glass substrates manufactured by Corning Ltd. This film formation was conducted using $SiH_4$, $CH_4$, $CO_2$, $N_2O$, and $H_2$ as reacting gases under the conditions shown below for each example. When $H_2$ is employed, it functions as a diluting gas, and is supplied in an amount to achieve a hydrogen dilution degree of 10 times to 20 times, preferably 20 times. The hydrogen dilution degree refers to the volume of $H_2$ gas relative to the volume of $SiH_4$ gas.

EXAMPLE 1 AND COMPARATIVE EXAMPLE 1

Films were formed without conducting dilution with hydrogen. For purposes of comparison, a conventional a-Si:C:H film was formed using $CH_4$, besides an a-Si:O:N:H film according to the present invention. Production conditions are shown in Table 1.

TABLE 1

|  | Example 1 | Comparative Example 1 |  |
|---|---|---|---|
| Substrate temperature | 200 | 200 | °C. |
| Reaction pressure | 0.2 | 0.2 | Torr |
| Power density | about 33 | about 33 | mW/cm$^2$ |
| SiH$_4$ gas flow | 20 | 20 | sccm |
| N$_2$O gas flow | 7 | — | sccm |
| CH$_4$ gas flow | — | 10 | sccm |

The band gap ($E_{opt}$) and photoconductivity ($\sigma_{ph}$) of each of the a-Si:O:N:H film and a-Si:C:H film produced under the above conditions were measured, and the results obtained are summarized in Table 2. It was ascertained that the amorphous silicon thin film according to the present invention had a higher $E_{opt}$ than the conventional film when the two films were made to have almost the same photoconductivity.

TABLE 2

| | Kind of film | $E_{opt}$ (eV) | $\sigma_{ph}$ $(\Omega \cdot cm)^{-1}$ |
|---|---|---|---|
| Example 1 | a-Si:O:N:H | 2.05 | $2.6 \times 10^{-6}$ |
| Comparative Example 1 | a-Si:C:H | 1.97 | $2.4 \times 10^{-6}$ |

EXAMPLES 2 AND 3

The effect of the ratio of hydrogen dilution on properties of the a-Si:O:N:H film according to the present invention was examined. Production conditions for this examination are shown in Table 3.

TABLE 3

| | Example 2 | Example 3 | |
|---|---|---|---|
| Substrate temperature | 100–250 | 100–250 | °C. |
| Reaction pressure | 0.5 | 0.5 | Torr |
| Power density | about 44 | about 44 | mW/cm$^2$ |
| SiH$_4$ gas flow | 20 | 20 | sccm |
| H$_2$ gas flow | 400 | 200 | sccm |
| N$_2$O gas flow | 5–15 | 5–30 | sccm |

The relationships between optical band gap, $E_{opt}$, and photoconductivity, $\sigma_{ph}$, for the amorphous silicon thin films produced in Examples 2 and 3 are shown in the sole Figure of the drawing by curves (1) and (2), respectively.

COMPARATIVE EXAMPLES 2 AND 3

Conventional a-Si:O:H and a-Si:C:H films were produced under the same conditions as in Example 2, except that CO$_2$ or CH$_4$ was used as a dopant gas in place of N$_2$O, with the ratio of hydrogen dilution being 20 times. Production conditions for these films are shown in Table 4, which conditions are representative ones in the plasma CVD method.

TABLE 4

| | Comparative Example 2 | Comparative Example 3 | |
|---|---|---|---|
| Substrate temperature | 100–250 | 100–250 | °C. |
| Reaction pressure | 0.5 | 0.5 | Torr |
| Power density | about 44 | about 44 | mW/cm$^2$ |
| SiH$_4$ gas flow | 20 | 20 | sccm |
| H$_2$ gas flow | 400 | 400 | sccm |
| CO$_2$ gas flow | 10–26 | — | sccm |
| CH$_4$ gas flow | — | 26–36 | sccm |

The sole Figure of the drawing shows the relationship between optical band gap ($E_{opt}$) and photoconductivity ($\sigma_{ph}$) for the amorphous silicon thin films produced under the production conditions for each of Examples 2 and 3 and Comparative Examples 2 and 3 given above. The N$_2$O, CO$_2$, or CH$_4$ gas flow for each of the run numbers given in the figure is as follows.

| Run No. | Gas Flow (sccm) | Hydrogen Dilution Ratio H$_2$/SiH$_4$ (times) |
|---|---|---|
| Example 2: | (N$_2$O) | |
| 731 | 5 | 20 |
| 735 | 10 | |
| 736 | 15 | |
| Example 3: | | |
| 726 | 5 | 10 |
| 725 | 10 | |
| 724 | 30 | |
| Comparative Example 2: | (CO$_2$) | |
| 732 | 10 | 20 |
| 730 | 18 | |
| 729 | 26 | |
| Comparative Example 3: | (CH$_4$) | |
| 733 | 26 | 20 |
| 734 | 36 | |

In the drawing Figure, curve (1) denotes the relationship between optical band gap ($E_{opt}$) and photoconductivity ($\sigma_{ph}$) for the a-Si:O:N:H films produced in Example 2 (hydrogen dilution ratio, 20 times), while curve (2) denotes that for the a-Si:O:N:H films produced in Example 3 (hydrogen dilution ratio, 10 times). The a-Si:O:N:H films produced under conditions of a hydrogen dilution ratio of 20 times showed improved photoconductivities, which were about two times those of the others when compared at the same optical band gap in the range of from 1.95 to 2.25 eV.

In the drawing Figure, curve (3) denotes the relationship between $E_{opt}$ and $\sigma_{ph}$ for the a-Si:O:H films produced under the production conditions for Comparative Example 2 with the hydrogen dilution ratio being 20 times, while curve (4) denotes that for the a-Si:C:H films produced under the production conditions for Comparative Example 3 with the hydrogen dilution ratio being 20 times.

It was ascertained that the films of Comparative Example 3 using CH$_4$ as a dopant gas was poor in $\sigma_{ph}$ despite the hydrogen dilution ratio of 20 times, as compared with the a-Si:O:N:H films of Example 2 obtained using N$_2$O as a dopant gas; the latter films had improved $\sigma_{ph}$ values higher than those of the former films by at least about one order of magnitude. Further, despite the hydrogen dilution ratio of 20 times, the films of Comparative Example 2 using CO$_2$ as a dopant gas had, in an $E_{opt}$ range of from 2.08 to 2.12 eV, insufficient $\sigma_{ph}$ values almost the same as those of the a-Si:O:N:H films obtained under conditions of a hydrogen dilution ratio of 10 times. It was also found that, at an $E_{opt}$ of 2.02 eV, the a-Si:O:N:H film obtained under conditions of a hydrogen dilution ratio of 20 times had an improved $\sigma_{ph}$ value higher by about one order of magnitude.

To sum up, the a-Si:O:N:H films produced under conditions of a hydrogen dilution ratio of 20 times showed improved photoconductivities at least about two times higher than those of the films obtained using CO$_2$ or CH$_4$ as a dopant gas, when compared at the same optical band gap.

As described above, the amorphous silicon thin film of the present invention has higher quality and a higher optical band gap than conventional a-Si:C:H films and a-Si:O:H films because it has been produced using an SiH$_4$-N$_2$O mixed gas as a source gas. These properties are improved further by diluting the SiH$_4$ with hydrogen.

By use of the amorphous silicon thin film of the present invention as a buffer layer and/or an i-layer, an amorphous-silicon solar cell of the single type or integrated type can be obtained, which has a high conductivity and a wide band gap.

While the invention has been described in detail and with reference to specific embodiments thereof, it will be apparent to one skilled in the art that various changes and modifications can be made therein without departing from the spirit and scope thereof.

What is claimed is:

1. A method for producing an amorphous silicon thin film comprising: depositing a silicon thin film on a substrate by plasma chemical vapor deposition, and supplying a mixture consisting essentially of a hydrogen-diluted $SiH_4$ gas and $N_2O$ during the plasma chemical vapor deposition as reacting gases for the plasma chemical vapor deposition, wherein the degree of hydrogen dilution is from 10 to 20.

2. The method for producing an amorphous silicon thin film of claim 1, wherein the degree of hydrogen dilution is 20.

3. The method of producing an amorphous silicon thin film of claim 1, wherein $N_2O$ and $SiH_4$ are supplied at an $N_2/SiH_4$ flow rate ratio of 0.25 to 1.5.

* * * * *